US 7,736,837 B2

United States Patent
Abdallah et al.

(10) Patent No.: US 7,736,837 B2
(45) Date of Patent: Jun. 15, 2010

(54) ANTIREFLECTIVE COATING COMPOSITION BASED ON SILICON POLYMER

(75) Inventors: David Abdallah, Bernardsville, NJ (US); Ruzhi Zhang, Pennington, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 392 days.

(21) Appl. No.: 11/676,671

(22) Filed: Feb. 20, 2007

(65) Prior Publication Data

US 2008/0199789 A1    Aug. 21, 2008

(51) Int. Cl.
G03F 7/095 (2006.01)
G03F 7/11 (2006.01)
G03F 7/30 (2006.01)
C08G 77/04 (2006.01)
G03F 7/40 (2006.01)
C08G 77/38 (2006.01)

(52) U.S. Cl. .............. 430/272.1; 430/326; 430/311; 430/323; 430/313; 430/325; 430/270.1; 528/40

(58) Field of Classification Search ............... None
See application file for complete search history.

(56) References Cited

U.S. PATENT DOCUMENTS

| | | | |
|---|---|---|---|
| 3,474,054 | A | 10/1969 | White |
| 4,200,729 | A | 4/1980 | Calbo |
| 4,251,665 | A | 2/1981 | Calbo |
| 4,491,628 | A | 1/1985 | Ito et al. |
| 5,187,019 | A | 2/1993 | Calbo et al. |
| 5,350,660 | A | 9/1994 | Urano et al. |
| 5,843,624 | A | 12/1998 | Houlihan et al. |
| 5,853,808 | A | 12/1998 | Arkles et al. |
| 6,069,259 | A | 5/2000 | Crivello |
| 6,087,064 | A | 7/2000 | Lin et al. |
| 6,420,088 | B1 | 7/2002 | Angelopoulos et al. |
| 6,447,980 | B1 | 9/2002 | Rahman et al. |
| 6,515,073 | B2 | 2/2003 | Sakamoto et al. |
| 6,723,488 | B2 | 4/2004 | Kudo et al. |
| 6,770,726 | B1 | 8/2004 | Arkles et al. |
| 6,790,587 | B1 | 9/2004 | Feiring et al. |
| 6,818,250 | B2 | 11/2004 | George et al. |
| 6,849,377 | B2 | 2/2005 | Feiring et al. |
| 6,866,984 | B2 | 3/2005 | Jung et al. |
| 6,916,543 | B2 * | 7/2005 | De et al. ............... 428/447 |
| 6,916,590 | B2 | 7/2005 | Kaneko et al. |
| 2002/0042020 | A1 * | 4/2002 | Gallagher et al. ......... 430/272.1 |
| 2002/0198269 | A1 * | 12/2002 | Zampini et al. ............ 521/50 |
| 2003/0120018 | A1 | 6/2003 | Baldwin et al. |
| 2003/0198877 | A1 * | 10/2003 | Pfeiffer et al. ............ 430/15 |
| 2005/0054216 | A1 | 3/2005 | Daley |
| 2005/0118541 | A1 | 6/2005 | Ahn et al. |
| 2005/0277058 | A1 | 12/2005 | Iwabuchi et al. |
| 2006/0058489 | A1 * | 3/2006 | Angelopoulos et al. ...... 528/38 |
| 2006/0105181 | A1 | 5/2006 | Lin et al. |
| 2006/0287454 | A1 * | 12/2006 | Yamahiro et al. ........... 526/279 |
| 2007/0015977 | A1 * | 1/2007 | McCann et al. ............ 600/309 |
| 2008/0008954 | A1 | 1/2008 | Abdallah et al. |
| 2008/0196626 | A1 | 8/2008 | Wu et al. |

FOREIGN PATENT DOCUMENTS

| | | |
|---|---|---|
| JP | 2005-221534 A | 8/2005 |
| WO | WO 97/10282 | 3/1997 |
| WO | WO 01/98834 A1 | 12/2001 |
| WO | WO 2004/078767 A * | 9/2004 |
| WO | WO 2004/113417 A1 | 12/2004 |
| WO | WO 2006/065321 A1 | 6/2006 |

OTHER PUBLICATIONS

English Language Abstract of JP 2005-221534 A, date of Jp document Aug. 18, 2005.
Machine Language English Translation from JPO of JP 2005-221534 A, printed Apr. 2007.
B. Arkles et al., "High Density Silicon Dioxide Coatings by UV and Thermal Processing", Silicones in Coatings III, Mar. 28-30, 2000, Barcelona, Spain.
B. Arkles et al., "Staged Development of Modified Silicon Dioxide Films", Journal of Sol-Gel Science and Technology vol. 8, pp. 465-pp. 469 (1997).
Y. Huo et al., "Synthesis and Properties of Hybrid Organic-Inorganic Materials Containing Covalently Bonded Luminescent Polygermanes", Chem. Mater. vol. 17, pp. 157-pp. 163 (2005).
S. Kodama, "Synthesis of Novel Fluoropolymer for 157nm Photoresists by Cyclo-polymerization", SPIE vol. 4690, pp. 76-83 (2002).
Q. Pan et al., "Spin-on-glass thin films prepared from a novel polysilsesquioxane by thermal and ultraviolet-irradiation methods", Thin Solid Films vol. 345, pp. 244-pp. 254 (1999).

(Continued)

Primary Examiner—Cynthia Hamilton
(74) Attorney, Agent, or Firm—Sangya Jain

(57) ABSTRACT

The present invention relates to an antireflecting coating composition which is capable of forming a crosslinked coating underneath a layer of photoresist comprising a silicon polymer, where the silicon polymer comprises at least one unit with the structure 1, (1)

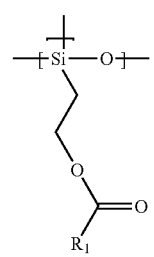

where, $R_1$ is selected from $C_1$-$C_4$ alkyl. The invention also relates to a process for imaging this composition.

14 Claims, 1 Drawing Sheet

OTHER PUBLICATIONS

Notification of Transmittal of the International Search Report and the Written Opinion of the International Searching Authority, or the Declaration (Form PCT/ISA/220), International Search Report (Form PCT/ISA/21 0), and Written Opinion of the International Searching Authority (Form PCT/ISA/237) for PCT/IB2008/000517, submitted Feb. 26, 2009 no publication date given.

Notification of Transmittal of the International Search Report and the Written Opinon of the International Searching Authoty, or the Declaration (Form PCT/ISA/220), International Search Report (Form PCT/ISA/210), and Written Opinion of the International Searching Authority (Form PCT/ISA/237) for PCT/IB2008/003523 dated Jun. 25, 2009.

* cited by examiner

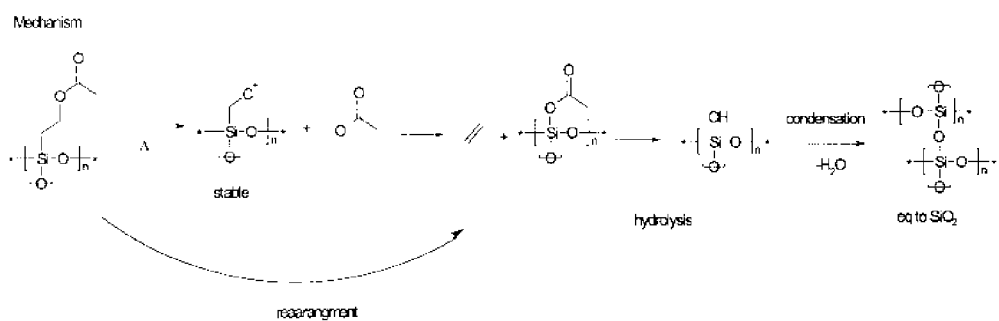
Figure 1 Mechanism of Crosslinking

ANTIREFLECTIVE COATING COMPOSITION BASED ON SILICON POLYMER

FIELD OF INVENTION

The present invention relates to an absorbing antireflective coating composition comprising silicon polymer, and a process for forming an image using the antireflective coating composition. The process is especially useful for imaging photoresists using radiation in the deep and extreme ultraviolet (uv) region.

BACKGROUND OF INVENTION

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the miniaturization of semiconductor devices has led to the use of new photoresists that are sensitive to lower and lower wavelengths of radiation and has also led to the use of sophisticated multilevel systems to overcome difficulties associated with such miniaturization.

Absorbing antireflective coatings in photolithography are used to diminish problems that result from back reflection of light from highly reflective substrates. Two major disadvantages of back reflectivity are thin film interference effects and reflective notching. Thin film interference, or standing waves, result in changes in critical line width dimensions caused by variations in the total light intensity in the photoresist film as the thickness of the photoresist changes or interference of reflected and incident exposure radiation can cause standing wave effects that distort the uniformity of the radiation through the thickness. Reflective notching becomes severe as the photoresist is patterned over reflective substrates containing topographical features, which scatter light through the photoresist film, leading to line width variations, and in the extreme case, forming regions with complete photoresist loss. An antireflective coating coated beneath a photoresist and above a reflective substrate provides significant improvement in lithographic performance of the photoresist. Typically, the bottom antireflective coating is applied on the substrate and then a layer of photoresist is applied on top of the antireflective coating. The antireflective coating is cured to prevent intermixing between the antireflective coating and the photoresist. The photoresist is exposed imagewise and developed. The antireflective coating in the exposed area is then typically dry etched using various etching gases, and the photoresist pattern is thus transferred to the substrate. In cases where the photoresist does not provide sufficient dry etch resistance, underlayers or antireflective coatings for the photoresist that act as a hard mask and are highly etch resistant during substrate etching are preferred, and one approach has been to incorporate silicon into a layer beneath the organic photoresist layer, either directly or below an additional organic coating, which maybe used to improve the lithography. A silicon layer directly beneath the photoresist layer is preferred. Silicon is highly etch resistant in processes where $O_2$ etching is used, and by providing an organic mask layer with high carbon content beneath the silicon antireflective layer a very large aspect ratio can be obtained. Thus, the organic mask can be much thicker than the photoresist or silicon layer above it. The organic mask, which is much thicker, can provide the substrate etch masking that the original photoresist was incapable of. Furthermore, these silicon containing antireflective coatings that also reduce or eliminate the reflected exposure radiation are highly desirable.

The present invention provides for a novel antireflective coating composition for a photoresist, where the composition comprises novel silicon containing polymer capable of crosslinking, with or without the crosslinking catalyst. The invention also provides for a process for using the antireflective coating to form an image using the novel composition. In addition to being used as an antireflective coating composition, the novel composition may also be used as a hard mask for protecting the substrate from etching gases or may also be used as a low k dielectric material. The novel composition is useful for imaging photoresists which are coated over the novel antireflective coating composition and also for etching the substrate. The novel composition enables a good image transfer from the photoresist to the substrate, and also has good absorption characteristics to prevent reflective notching and line width variations or standing waves in the photoresist. Additionally, substantially no intermixing is present between the antireflective coating and the photoresist film. The antireflective coating also has good solution stability and forms thin films with good coating quality, the latter being particularly advantageous for lithography.

SUMMARY OF THE INVENTION

The present invention relates to an antireflecting coating composition which is capable of forming a crosslinked coating underneath a layer of photoresist, comprising a silicon polymer, where the silicon polymer comprises at least one unit with the structure 1,

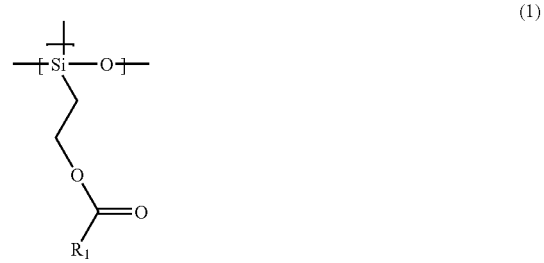

(1)

where, $R_1$ is selected from $C_1$-$C_4$ alkyl. The invention also relates to a process for imaging this composition.

BRIEF DESCRIPTION OF DRAWINGS

FIG. 1 describes a possible mechanism of crosslinking of the polymer.

DESCRIPTION OF THE INVENTION

The invention relates to an absorbing, and crosslinkable or curable silicon based antireflective coating composition which is coated over a substrate and beneath a photoresist. The invention further relates to a process of imaging the photoresist using the antireflective coating composition. The polymer of the antireflective coating composition is a silicon polymer comprising a moiety with a β-substituted ethyl group pendant from silicon, which is especially suitable for protecting the silicon polymer in the liquid coating composition, but when desired, upon heating the polymer can be crosslinked or cured. Thus the β-substituted ethyl protecting group provides the composition with a good shelf life and processing stability, preventing it from crosslinking until the process requires it. The β-substituted ethyl group attached to silicon prevents the formation of hydroxyl groups by hydrolysis which may further crosslink the polymer. The protecting group also prevents crosslinking of the polymer due to moisture until the film is ready to be crosslinked.

The novel antireflecting coating composition of the present invention which is capable of forming a crosslinked absorbing coating underneath a layer of photoresist comprises a silicon polymer, where the silicon polymer comprises at least one unit with structure 1,

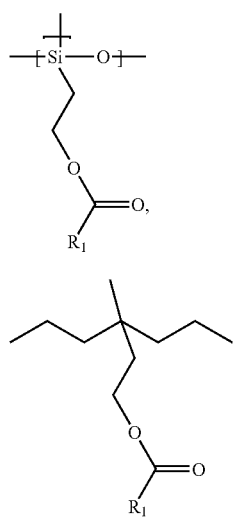

where, $R_1$ is selected from $C_1$-$C_4$ alkyl. The structure (1) is part of a siloxane polymer and the pendant group from silicon in structure (1) is referred to herein as the β-substituted ethyl group as shown in structure (2), where the ethyl may be further substituted. In order for the crosslinking to take place in the film the β position of the ethyl group is usually unsubstituted. Although not being bound by theory, it is believed that the complete or partial deprotection and curing of the film may take place as illustrated in the mechanism in FIG. 1. The reaction may go through an intermediate or be concerted. Curing can take place by the complete or partial unblocking of the β-substituted ethyl group pendant from silicon. Ethylene, as a reaction product, is easily removed from the film and does not lead to defects in the crosslinked coating. A curing catalyst may be added to the antireflective coating composition to further increase the crosslink density to minimize intermixing with photoresist and decrease porosity of the antireflective coating film.

The antireflective coating composition comprises, in one embodiment, an absorbing silicon polymer comprising the unit of structure 1 and an absorbing moeity. The absorbing moiety or chromphore in the silicon polymer is one capable of absorbing the radiation used to imagewise expose the photoresist coated over the film of the antireflective coating composition. The absorbing polymer is described herein. The antireflective coating with the absorbing silicon polymer may also be essentially free of Si—H and/or Si-halogen moieties. Additionally, the antireflective coating with the absorbing silicon polymer may also be free of Si—OH moiety, or where the composition comprises less than 10 Si—OH per 100 silicon atoms, preferably less than 5, more preferably 3, even more preferably 1. The halogen can be chloride, fluoride, bromide, etc. The composition may further comprise a crosslinking or curing catalyst. In addition to the silicon polymer and the crosslinking catalyst, the composition can optionally further comprise a dye compound comprising the chromophore. The dye compound may be a monomeric or polymeric dye. The crosslinking catalyst and the dye are described herein. The polymer may be a copolymer of a silane monomer comprising the β-substituted ethyl group and other silane monomers that do comprise an absorbing chromophore, such as those described herein. More specifically, such absorbing comonomers may be methyl phenyl diethoxysilane, methyl phenyl dipropoxysilane, methyl phenyl diphenyloxysilane, ethyl phenyl dimethoxysilane, ethyl phenyl diethoxysilane, methyl anthracyl dimethoxysilane, ethyl anthracyl diethoxysilane, propyl anthracyl dipropoxysilane, methyl phenyl ethoxypropoxysilane, ethyl phenyl methoxyethoxysilane, diphenyl dimethoxysilane, diphenyl methoxyethoxysilane, phenyl trimethoxysilane, phenyl triethoxysilane, phenyl tripropoxysilane, anthracyl trimethoxysilane, anthracyl tripropoxysilane, and equivalents.

In another embodiment of the antireflective coating composition, the antireflective coating composition comprises a silicon polymer which is essentially free of a chromophore and comprises the unit of structure 1, and a dye. The nonabsorbing polymer is described herein. The composition may further comprise a crosslinking or curing catalyst. The chromophore is a moiety that is capable of absorbing the radiation used to imagewise expose the photoresist coated over the film of the antireflective coating composition. The antireflective coating with the silicon polymer may also be essentially free of Si—H moiety and/or Si-halogen moiety. Additionally, the antireflective coating with the silicon polymer may also be free of Si—OH moiety or where the composition comprises less than 10 Si—OH per 100 silicon atoms, preferably less than 5, more preferably 3, even more preferably 1. The halogen can be chloride, fluoride, bromide, etc. In addition to the silicon polymer and the optional crosslinking catalyst, the composition further comprises a dye compound comprising the chromophore, where the dye may be a monomeric or polymeric dye. The crosslinking catalyst and the dye compound are described herein. The polymer which is essentially free of a chromophore comprises the unit of structure 1, where the polymer may be synthesized from a silane monomer comprising the β-substituted ethyl group and the polymer may be a homopolymer or a copolymer. Thus the polymer may be for example a homopolymer of acetoxyethyltrimethoxysilane or equivalent compounds. The polymer may also be a copolymer of a silane monomer comprising the β-substituted ethyl group and other silane monomers that do not comprise an absorbing chromophore, such as those described below. More specifically, such comonomers may be tetraethoxysilane (TEOS), tetramethoxysilane (TMOS), methyltriethoxysilane, ethyltriethoxysilane, propyltriethoxysilane and equivalents. Copolymers may be of the type shown in structures (4) and (5)

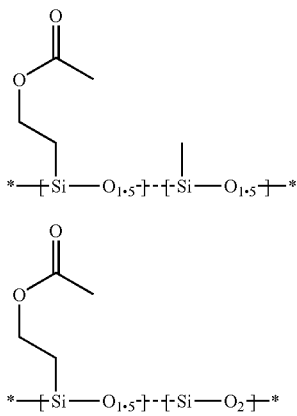

(4)

(5)

In yet another embodiment of the antireflective coating composition, the silicon polymer comprises the β-substituted ethyl group and the composition is free of an absorbing moiety or compound. The composition does not comprise a dye compound and the polymer is free of an absorbing chromophore. The antireflective coating with the silicon polymer may also be essentially free of Si—H and/or Si-halogen moiety. Additionally, the absorbing silicon polymer may also be free of Si—OH moiety or where the composition comprises less than 10 Si—OH per 100 silicon atoms, preferably less than 5, more preferably 3, even more preferably 1. The halogen can be chloride, fluoride, bromide, etc. The composition prevents reflection by adjusting the film thickness of the coating such that reflections are eliminated by interference effects caused by destructive interference at the photoresist and antireflective coating film interface. Such a composition comprises the polymer and may further comprise a crosslinking catalyst described herein. The silicon polymer may be a homopolymer comprising units of structure (2), or of acetoxyethyltrimethoxysilane or equivalent compounds. The polymer may also be a copolymer of a silane monomer comprising the β-substituted ethyl group and other silane monomers that do not comprise an absorbing chromophore, such as those described below. More specifically, such comonomers may be tetraethoxysilane (TEOS), tetramethoxysilane (TMOS), methyltriethoxysilane, ethyltriethoxysilane, propyltriethoxysilane and equivalents. Polymers can be as shown in structures (4) and (5).

The silicon polymer useful in the present invention is made from the condensation polymerization of organosilane polymers containing the β-substituted ethyl group. The β-substituted ethyl group is present in the polymer of the present invention. Typically the polymer formed is a silsesquioxane polymer comprising the β-substituted ethyl group. The polymer may be a homopolymer with or without absorbing chromophore or a copolymer with or without an absorbing chromophore.

The silicon polymers which are absorbing and nonabsorbing are described below.

Absorbing Silicon Polymer

The silicon polymer of the novel composition may comprise a chromophore and a β-substituted ethyl group, and may be formed by reacting silane monomer(s) containing the β-substituted ethyl group or its equivalent and a chromophore. The chromophore and the β-substituted ethyl group may be present in the same monomer or in different monomers. The polymer may be a homopolymer or copolymerized with other silicon monomers. When a copolymer is formed the monomer comprises both a chromophore and the β-substituted ethyl group of structure (2).

The silicon polymer comprising the chromophore and the β-substituted ethyl group is typically a siloxane or organosiloxane polymer containing SiO units within the polymer structure, where the SiO units may be within the polymer backbone and/or pendant from the polymer backbone. Siloxane polymers known in the art may be used. Various types of siloxane polymers are known in the art and are exemplified in the following references which are incorporated herein by reference, WO 2004/113417, U.S. Pat. Nos. 6,069,259, 6,420,088 , 6,515,073 ,. 6,770,726 , 2005277058, WO 2006/065321 and JP 2005-221534. Examples of siloxane polymers, without limitation, are linear polymers and ladder or network (silsesquioxane) types of polymers or polymers comprising mixtures of linear and network blocks. Polyhedral structures of siloxanes are also known and are part of the invention. The silicon polymer may have various structures.

In one embodiment the present absorbing siloxane polymer comprises units described by (i) and/or (ii), $(R^1SiO_{3/2})$ or, $(R^1SiO_{3/2})$ and $(R^2SiO_{3/2})$     (i), $(R'(R'')SiOx)$     (ii), where $R^1$ is independently a moiety comprising the β-substituted ethyl group of structure 2, $R^2$ is independently a moiety comprising a chromophore group, R' and R'' are independently selected from $R^1$ and $R^2$, and x=½ or 1. Typically $R^2$ is a chromophore group such as an aromatic or aryl moiety. In another embodiment the siloxane polymer comprises linear polymeric units described by (iii) and (iv), $-(A^1(R^1)SiO)-$     (iii, and $-((A^2)R^2SiO)-$     (iv), where, $R^1$ and $R^2$ are as above, $A^1$ and $A^2$ are independently hydroxyl, $R^1$, $R^2$, halide (such as fluoride and chloride), alkyl, OR, OC(O)R, alkylketoxime, unsubstituted aryl and substituted aryl, alkylaryl, alkoxy, acyl and acyloxy, and R is selected from alkyl, unsubstituted aryl and substituted aryl. In yet another embodiment the siloxane polymer contains mixtures of network and linear units, that is, network units comprising (i) and/or (ii) and linear units comprising (iii) and/or (iv). Generally, a polymer comprising predominantly the silsesquioxane or network type of units are preferred, since they provide higher silicon content, but mixtures can also be useful.

Examples of the chromophore are without limitation, a substituted or unsubstituted phenyl group, a substituted or unsubstituted anthracyl group, a substituted or unsubstituted phenanthryl group, a substituted or unsubstituted naphthyl group, a sulfone-based compound, benzophenone-based compound, a substituted or an unsubstituted heterocyclic aromatic ring containing heteroatoms selected from oxygen, nitrogen, sulfur; and a mixture thereof.

The polymer may comprise a comonomeric unit with the absorbing chromophore which has the structure 3 and a monomeric unit of structure (1),

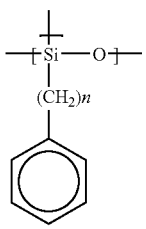

(3)

where n=0-4

The copolymer can be derived from units comprising the chromophore and the β-substituted ethyl group, and other units comprising groups selected from at least one of alkoxy, alkyl, epoxy, acyl, etheralkyl, unsubstituted aryl and substituted aryl, silyl, oxysilyl, etc.

Nonabsorbing Silicon Polymer

The antireflective coating composition comprising the polymer that has essentially no absorbing chromophore but comprises the unit of structure (1). The polymers are synthesized as described herein but exclude any monomers comprising a chromophore.

The nonabsorbing siloxane polymer comprises units described by (i) and/or (ii),

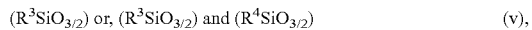  (v),

  (vi), where, $R^3$ is independently a moiety comprising the β-substituted ethyl group of structure (2), $R^4$ is independently a moiety comprising a nonchromophoric group, $R^5$ and $R^6$ are independently selected from $R^3$ and $R^4$, and x=½ or 1. Typically $R^4$ is a group other than an aromatic or aryl moiety. In another embodiment the siloxane polymer comprises linear polymeric units described by (iii) and (iv),

  (vii), and

  (viii), where, $R^3$ and $R^4$ are as above, $A^3$ and $A^4$ are independently hydroxyl, $R^3$ and $R^4$, halide (such as fluoride and chloride), alkyl, OR, OC(O)R, alkylketoxime, alkoxy, acyl and acyloxy, and R is selected from alkyl. In yet another embodiment the siloxane polymer contains mixtures of network and linear units, that is, network units comprising (v) and/or (vi) and linear units comprising (vii) and/or (viii). Generally, a polymer comprising predominantly the silsesquioxane or network type of units are preferred, since they provide superior dry etch resistance, but mixtures can also be useful.

The homopolymer can be derived from monomers comprising the β-substituted ethyl group and excluding any absorbing group.

The copolymer can be derived from units comprising the chromophore and the β-substituted ethyl group, and other units comprising groups selected from at least one of alkoxy, alkyl, epoxy, acyl, etheralkyl, silyl, oxysilyl, etc.

The silicon polymer useful in the present antireflective coating composition in any of the embodiments has a silicon content of greater than 15 weight %, preferable greater than 20 weight %, and more preferably greater than 30 weight %.

Dye

The dye compound may be a polymeric compound or a small molecule compound comprising an absorbing chromophore. The chromophore groups can be exemplified by aromatic functionalities or heteroaromatic functionalities. Further examples of the chromophore are without limitation, a substituted or unsubstituted phenyl group, a substituted or unsubstituted anthracyl group, a substituted or unsubstituted phenanthryl group, a substituted or unsubstituted naphthyl group, a sulfone-based compound, benzophenone-based compound, a substituted or an unsubstituted heterocyclic aromatic ring containing heteroatoms selected from oxygen, nitrogen, sulfur; and a mixture thereof. Specifically, the chromophore functionality can be bisphenylsulfone-based compounds, naphthalene or anthracene based compounds having at least one pendant group selected from hydroxy group, carboxyl group, hydroxyalkyl group, alkyl, alkylene, etc. Examples of the chromophore moiety are also given in US 2005/0058929. More specifically the chromophore may be phenyl, benzyl, hydroxyphenyl, 4-methoxyphenyl, 4-acetoxyphenyl, t-butoxyphenyl, t-butylphenyl, alkylphenyl, chloromethylphenyl, bromomethylphenyl, 9-anthracene methylene, 9-anthracene ethylene, 9-anthracene methylene, and their equivalents. In one embodiment a substituted or unsubstituted phenyl group is used.

The dye may be selected from trishydroxytriphenyl ethane, tetrahydroxybenzophenone, alpha,alpha,alpha'-Tris(4-hydroxyphenyl)-1-ethyl-4-isopropylbenzene, homopolymers or copolymers of hydroxystyrene, homopolymers or copolymers of phenylsilsesqioxane, homopolymers or copolymers of methylphenylsilsesqioxane, homopolymers or copolymers of hydroxyphenylsilsesqioxane.

Crosslinking/Curing Agent

The curing catalyst may be selected from any that can cure the silicon polymer. Examples of curing catalysts are salts, which may also be photoacid generators and thermal acid generators. One example of curing salts are disclosed in U.S. application Ser. No. 11/425,817 incorporated herein by reference, but other curing salts may also be used. More than one catalyst may be used. The (i) a strong base catalyst and/or strong base generator source; or (ii) a sulfuric acid generator which decomposes at a temperature less than or equal to about 500° C. are well known to those of ordinary skill in the art as is their method of making, which can be based on neutralizing acids with the base of interest.

One example of a salt is a strong base catalyst and/or strong base generator source which can be represented by the formula $Z^+ A^-$, where $Z^+$ is a cation such as tetraalkylammonium, tetraalkylphosphonium, trialkylmonoarylammonium, trialkylmonoarylphosphonium, dialkyldiarylammonium, dialkyldiarylphosphonium, monoalkyltriarylammonium, monoalkyltriarylphosphonium, tetraarylammonium, tetraarylphosphonium, unsubstituted or substituted iodonium, and unsubstituted or substituted sulfonium. Examples of the mentioned cations include tetramethylammonium, tetrabutylammonium, tetraphenylammonium, tetramethylphosphonium, tetraphenylphosphonium, trimethylphenylammonium, trimethylphenylphosphonium, dimethyldiphenylammonium, dimethyldiphenylphosphonium, triphenylsulfonium, (4-t-butylphenyl)diphenylsulfonium, diphenyiodonium, and bis (4-t-butylphenyl)iodonium) and the like, etc. A is an anion containing a group such as halide, hypohalite, halite, halate, perhalate, hydroxide, monocarboxylate, dicarboxylate, carbonate, bicarbonate, silanolate, alkoxide, aryloxide, nitrate, azide, peroxymonosulfate, peroxydisulfate, dihydrogen phosphate, phosphate, sulfate, bisulfate, sulfonate, and guanidine, as well as the hydrates thereof, and mixtures thereof. For the anion, the anion will contain one of the aforementioned groups or the group itself will be the anion. Monocarboxylate refers to anions of organic acids containing one carboxy group with the hydrogen removed and include, for example, acetate, formate, proprionate, and the like. Dicarboxylate refers to anions of organic acids contaiing two carboxy groups where one or both of the hydrogens are removed and iniucde succinate, malonate, monomalonate (where only one hydrogen is removed), adipate, and the like.

For (ii) a sulfuric acid generator which decomposes at a temperature less than or equal to about 500° C., a sulfuric acid generator is a compound that will generate sulfuric acid when heated. Examples of the sulfuric acid generator which decomposes at a temperature less than or equal to about 500° C. can include sulfuric acid, hydrogen sulfate or sulfate salts of trialkylamine, unsubstituted or substituted dialkylmonocyloalkylamine, unsubstituted or substituted monoalkyldicycloalkylamine, unsubstituted or substituted tricycloalkylamine, triarylamine, unsubstituted or substituted diarylmonoaikylamine, unsubstituted or substituted monoaryldialkylamine, unsubstituted or substituted triarylamine, unsubstituted or substituted aziridine, unsubstituted or substituted azetidine, unsubstituted or substituted pyrrol, unsubstituted or substituted pyridine, unsubstituted or substituted piperidine, or unsubstituted or substituted piperazine, such as triethylamine hydrogen sulfate, tributylamine hydrogen sulfate, piperazine sulfate, and the like.

Examples of photoacid generators are without limitation, onium salts, sulfonate compounds, nitrobenzyl esters, triazines, etc. The preferred photoacid generators are onium salts and sulfonate esters of hydoxyimides, specifically diphenyl iodonium salts, triphenyl sulfonium salts, dialkyl iodonium salts, triakylsulfonium salts, and mixtures thereof.

A thermal acid generator is capable of generating a strong acid upon heating, which can cure the silicon polymer. The thermal acid generator (TAG) used in the present invention may be any one or more that upon heating generates an acid which can react with the cyclic ether and propagate crosslinking of the polymer present in the invention, particularly preferred is a strong acid such as a sulfonic acid. Preferably, the thermal acid generator is activated at above 100° C. and more preferably at above 120° C., and even more preferably at above 150° C. The photoresist film is heated for a sufficient length of time to react with the coating. Examples of thermal acid generators are metal-free iodonium and sulfonium salts, such as in FIG. 4. Examples of TAGs are nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid. lodonium salts are preferred and can be exemplified by iodonium fluorosulfonates, iodonium tris (fluorosulfonyl)methide, iodonium bis(fluorosulfonyl)methide, iodonium bis(fluorosulfonyl)imide, iodonium quaternary ammonium fluorosulfonate, iodonium quaternary ammonium tris(fluorosulfonyl)methide, and iodonium quaternary ammonium bis(fluorosulfonyl)imide. A variety of aromatic (anthracene, naphthalene or benzene derivatives) sulfonic acid amine salts can be employed as the TAG, including those disclosed in U.S. Pat. Nos. 3,474,054, 4,200,729, 4,251,665 and 5,187,019. Preferably the TAG will have a very low volatility at temperatures between 170-220° C. Examples of TAGs are those sold by King Industries under Nacure and CDX names. Such TAG's are Nacure 5225, and CDX-2168E, which is a dodecylbenzene sulfonic acid amine salt supplied at 25-30% activity in propylene glycol methyl ether from King Industries, Norwalk, Conn. 06852, USA.

In the above definitions and throughout the present specification, unless otherwise stated the terms used are described below.

Alkyl means linear or branched alkyl having the desirable number of carbon atoms and valence. The alkyl group is generally aliphatic and may be cyclic (cycloaliphatic) or acyclic (i.e. noncyclic). Suitable acyclic groups can be methyl, ethyl, n-or iso-propyl, n-,iso, or tert-butyl, linear or branched pentyl, hexyl, heptyl, octyl, decyl, dodecyl, tetradecyl and hexadecyl. Unless otherwise stated, alkyl refers to 1-10 carbon atom moeity. The cyclic alkyl (cycloaliphatic) groups may be mono cyclic or polycyclic. Suitable example of monocyclic alkyl groups include unsubstituted or substituted cyclopentyl, cyclohexyl, and cycloheptyl groups. The substituents may be any of the acyclic alkyl groups described herein. Suitable bicyclic alkyl groups include substituted bicycle[2.2.1]heptane, bicyclo[2.2.2]octane, bicyclo[3.2.1] octane, bicyclo[3.2.2]nonane, and bicyclo[3.3.2]decane, and the like. Examples of tricyclic alkyl groups include tricyclo $[5.4.0.0.^{2,9}]$undecane, tricyclo$[4.2.1.2.^{7,9}]$undecane, tricyclo $[5.3.2.0.^{4,9}]$dodecane, and tricyclo$[5.2.1.0.^{2,6}]$decane. As mentioned herein the cyclic alkyl groups may have any of the acyclic alkyl groups as substituents.

Aryl or aromatic groups contain 6 to 24 carbon atoms including phenyl, tolyl, xylyl, naphthyl, anthracyl, biphenyls, bis-phenyls, tris-phenyls and the like. These aryl groups may further be substituted with any of the appropriate substituents e.g. alkyl, alkoxy, acyl or aryl groups mentioned hereinabove. Similarly, appropriate polyvalent aryl groups as desired may be used in this invention. Representative examples of divalent aryl groups include phenylenes, xylylenes, naphthylenes, biphenylenes, and the like.

Alkoxy means straight or branched chain alkoxy having 1 to 10 carbon atoms, and includes, for example, methoxy, ethoxy, n-propoxy, isopropoxy, n-butoxy, isobutoxy, tert-butoxy, pentyloxy, hexyloxy, heptyloxy, octyloxy, nonanyloxy, decanyloxy, 4-methylhexyloxy, 2-propylheptyloxy, 2-ethyloctyloxy and phenyloxy.

Aralkyl means aryl groups with attached substituents. The substituents may be any such as alkyl, alkoxy, acyl, etc. Examples of monovalent aralkyl having 7 to 24 carbon atoms include phenylmethyl, phenylethyl, diphenylmethyl, 1,1- or 1,2-diphenylethyl, 1,1-, 1,2-, 2,2-, or 1,3-diphenyipropyl, and the like. Appropriate combinations of substituted aralkyl groups as described herein having desirable valence may be used as a polyvalent aralkyl group.

Furthermore, and as used herein, the term "substituted" is contemplated to include all permissible substituents of organic compounds. In a broad aspect, the permissible substituents include acyclic and cyclic, branched and unbranched, carbocyclic and heterocyclic, aromatic and nonaromatic substituents of organic compounds. Illustrative substituents include, for example, those described hereinabove. The permissible substituents can be one or more and the same or different for appropriate organic compounds. For purposes of this invention, the heteroatoms such as nitrogen may have hydrogen substituents and/or any permissible substituents of organic compounds described herein which satisfy the valencies of the heteroatoms. This invention is not intended to be limited in any manner by the permissible substituents of organic compounds.

The silicon polymer, typically a siloxane polymer, used in the present invention may be synthesized as known in the art.

Typically the siloxane polymer is made by reacting a compound containing the silicon unit(s) or silane(s), and water in the presence of a hydrolysis catalyst to form the siloxane polymer. Homopolymers or copolymers may be used. The ratio of the various types of substituted silane(s) used to form the novel siloxane polymer is varied to provide a polymer with the desirable structure and properties. In an absorbing copolymer, the silane compound(s) containing the chromophoric unit can vary from about 5 mole % to about 90 mole %, preferably from about 5 mole % to about 75 mole %; the silane compound(s) containing the β-substituted ethyl group of structure (2) can vary from about 5 mole % to about 90 mole %, preferably from about 10 mole % to about 90 mole %. Mixtures of different silanes containing the functional groups described may be used. In an nonabsorbing copolymer, the silane compound(s) containing the β-substituted ethyl group of structure (2) can vary from about 5 mole % to about 90 mole %, preferably from about 10 mole % to about 90 mole %; the other silane compound(s) forming the comonomeric units can vary from about 5 mole % to about 90 mole %, preferably from about 5 mole % to about 75 mole %. Mixtures of different silanes containing the functional groups described may be used. The hydrolysis catalyst can be a base or an acid, exemplified by mineral acid, organic carboxylic acid, organic quaternary ammonium base. Further examples of specific catalyst are acetic acid, propionic acid, phosphoric acid, or tetramethylammonium hydroxide. The reaction may be heated at a suitable temperature for a suitable length of time till the reaction is complete. Reaction temperatures can range from about 25° C. to about 170° C. The reaction times can range from about 10 minutes to about 24 hours. Additional organic solvents may be added to solubilize the silane in water, such solvents which are water miscible solvents (e.g. tetrahydrofuran and propyleneglycol monomethylether acetate (PGMEA)) and lower ($C_1$-$C_5$) alcohols, further exemplified by ethanol, isopropanol, 2-ethoxyethanol, and 1-methoxy-2-propanol. The organic solvent can range from 5 weight % to about 90 weight %. Other methods of forming the siloxane polymer may also be used, for example suspension in aqueous solution or emulsion in aqueous solution. The silanes may contain the ≈-substituted ethyl group of structure (2) functionality and the chromophore in the monomers or may be incorporated into a formed siloxane polymer by reacting it with the compound or compounds containing the functionality or functionalities. The silanes may contain other groups such as halides, hydroxyl, OC(O)R, alkylketoxime, aryl, alkylaryl, alkoxy, acyl and acyloxy; where R is selected from alkyl, unsubstituted aryl and substituted aryl, which are the unreacted substituents of the silane monomer. The novel polymer may contain unreacted and/or hydrolysed residues from the silanes, that is, silicon with end groups such as hydroxyl, hydrogen, halide (e.g. chloride or fluoride), acyloxy, or $OR^a$, where $R^a$ is selected from ($C_1$-$C_{10}$) alkyl, C(O)$R^b$, $NR^b(RC^c)$ and aryl, and $R^b$ and $R^c$ are independently ($C_1$-$C_{10}$) or aryl. These residues could be of the structure, $(XSi(Y)O_x)$ where X and Y are independently selected from OH, H, OSi—, $OR^a$, where $R^a$ is selected from ($C_1$-$C_{10}$) alkyl, unsubstituted aryl, substituted aryl, C(O)$R^b$, $NR^b(R^c)$, halide, acyloxy, acyl, oxime, and aryl, and $R^b$ and $R^c$ are independently ($C_1$-$C_{10}$) or aryl, Y can also be $R^1$-$R^6$ (as described previously), and x=½ or 1.

Silicon-containing antireflective coating materials are typically synthesized from a variety of silane reactants including, for example:

(a) dimethoxysilane, diethoxysilane, dipropoxysilane, diphenyloxysilane, methoxyethoxysilane, methoxypropoxysilane, methoxyphenyloxysilane, ethoxypropoxysilane, ethoxyphenyloxysilane, methyl dimethoxysilane, methyl methoxyethoxysilane, methyl diethoxysilane, methyl methoxypropoxysilane, methyl methoxyphenyloxysilane, ethyl dipropoxysilane, ethyl methoxypropoxysilane, ethyl diphenyloxysilane, propyl dimethoxysilane, propyl methoxyethoxysilane, propyl ethoxypropoxysilane, propyl diethoxysilane, propyl diphenyloxysilane, butyl dimethoxysilane, butyl methoxyethoxysilane, butyl diethoxysilane, butyl ethoxypropoxysilane, butyl dipropoxysilane, butyl methylphenyloxysilane, dimethyl dimethoxysilane, dimethyl methoxyethoxysilane, dimethyl diethoxysilane, dimethyl diphenyloxysilane, dimethyl ethoxypropoxysilane, dimethyl dipropoxysilane, diethyl dimethoxysilane, diethyl methoxypropoxysilane, diethyl diethoxysilane, diethyl ethoxypropoxysilane, dipropyl dimethoxysilane, dipropyl diethoxysilane, dipropyl diphenyloxysilane, dibutyl dimethoxysilane, dibutyl diethoxysilane, dibutyl dipropoxysilane, dibutyl methoxyphenyloxysilane, methyl ethyl dimethoxysilane, methyl ethyl diethoxysilane, methyl ethyl dipropoxysilane, methyl ethyl diphenyloxysilane, methyl propyl dimethoxysilane, methyl propyl diethoxysilane, methyl butyl dimethoxysilane, methyl butyl diethoxysilane, methyl butyl dipropoxysitane, methyl ethyl ethoxypropoxysilane, ethyl propyl dimethoxysilane, ethyl propyl methoxyethoxysilane, dipropyl dimethoxysilane, dipropyl methoxyethoxysilane, propyl butyl dimethoxysilane, propyl butyl diethoxysilane, dibutyl methoxyethoxysilane, dibutyl methoxypropoxysilane, dibutyl ethoxypropoxysilane, trimethoxysilane, triethoxysilane, tripropoxysilane, triphenyloxysilane, dimethoxymonoethoxysilane, diethoxymonomethoxysilane, dipropoxymonomethoxysilane, dipropoxymonoethoxysilane, diphenyloxymonomethoxysilane, diphenyloxymonoethoxysilane, diphenyloxymonopropoxysilane, methoxyethoxypropoxysilane, monopropoxydimethoxysilane, monopropoxydiethoxysilane, monobutoxydimethoxysilane, monophenyloxydiethoxysilane, methyl trimethoxysilane, methyl triethoxysilane, methyl tripropoxysilane, ethyl trimethoxysilane, ethyl tripropoxysilane, ethyl triphenyloxysilane, propyl trimethoxysilane, propyl triethoxysilane, propyl triphenyloxysilane, butyl trimethoxysilane, butyl triethoxysilane, butyl tripropoxysilane, butyl triphenyloxysilane, methyl monomethoxydiethoxysilane, ethyl monomethoxydiethoxysilane, propyl monomethoxydiethoxysilane, butyl monomethoxydiethoxysilane, methyl monomethoxydipropoxysilane, methyl monomethoxydiphenyloxysilane, ethyl monomethoxydipropoxysilane, ethyl monomethoxydiphenyloxysilane, propyl monomethoxydipropoxysilane, propyl monomethoxydiphenyloxysilane, butyl monomethoxydipropoxysilane, butyl monomethoxydiphenyloxysilane, methyl methoxyethoxypropoxysilane, propyl methoxyethoxypropoxysilane, butyl methoxyethoxypropoxysilane, methyl monomethoxymonoethoxybutoxysilane, ethyl monomethoxymonoethoxy monobutoxysilane, propyl monomethoxymonoethoxy monobutoxysilane, butyl monomethoxymonoethoxy monobutoxysilane, tetramethoxysilane, tetraethoxysilane, tetrapropoxysilane, tetrabutoxysilane, tetraphenyloxysilane, trimethoxymonoethoxysilane, dimethoxydiethoxysilane, triethoxymonomethoxysilane, trimethoxymonopropoxysilane monomethoxytributoxysilane, monomethoxytriphenyloxysilane, dimethoxydipropoxysilane, tripropoxymonomethoxysilane, trimethoxymonobutoxysilane, dimethoxydibutoxysilane, triethoxymonopropoxysilane, diethoxydipropoxysilane, tri butoxymonopropoxysilane, dimethoxymonoethoxymonobutoxysilane, diethoxymonomethoxy monobutoxysilane, diethoxymonopropoxymonobutoxysilane, dipropoxymonomethoxy monoethoxysilane, dipropoxymonomethoxy monobutoxysilane, dipropoxymonoethoxymonobutoxysilane, dibutoxymonomethoxy monoethoxysilane, dibutoxymonoethoxy monopropoxysilane and monomethoxymonoethoxymonopropoxy monobutoxysilane, and oligomers thereof.

(b) Halosilanes, including chlorosilanes, such as trichlorosilane, methyltrichlorosilane, ethyltrichlorosilane, phenyltrichlorosilane, tetrachlorosilane, dichlorosilane, methyldichlorosilane, dimethyldichlorosilane, chiorotriethoxysilane, chlorotrimethoxysilane, chloromethyltriethoxysilane, chloroethyltriethoxysilane, chlorophenyltriethoxysilane, chloromethyltrimethoxysilane, chloroethyltrimethoxysilane, and chlorophenyltrimethoxysilane are also used as silane reactants. In addition, silanes that can undergo hydrolysis and condensation reactions such as acyloxysilanes, or alkylketoximesilanes, are also used as silane reactants.

(c) Silanes bearing epoxy functionality, include 2-(3,4-epoxycyclohexyl)ethyl-trimethoxysilane, 2-(3,4-epoxycyclohexyl )ethyl-triethoxysilane, 2-(3,4-epoxycyclohexyl)ethyl-tripropoxysilane, 2-(3,4-epoxycyclohexyl)ethyl-triphenyloxysilane, 2-(3,4-epoxycyclohexyl)ethyl-diethoxymethoxysilane, 2-(3,4-epoxycyclohexyl)ethyl-dimethoxyethoxysilane, 2-(3,4-epoxycyclohexyl)ethyl-trichlorosilane 2-(3,4-epoxycyclohexyl)ethyl-triacetoxysilane, (glycidyloxypropyl)-trimethoxysilane, (glycidyloxypropyl)-triethoxysilane, (glycidyloxypropyl)-tripropoxysilane, (glycidyloxypropyl)-triphenyloxysilane, (glycidyloxypropyl)-diethoxymethoxysilane, (glycidyloxypropyl)-dimethoxyethoxysilane, (glycidyloxypropyl)-trichlorosilane, and (glycidyloxypropyl)-triacetoxysilane (d) Silanes bearing chromophore functionality, include phenyl dimethoxysilane, phenyl methoxyethoxysilane, phenyl diethoxysilane, phenyl methoxypropoxysilane, phenyl methoxyphenyloxysilane, phenyl dipropoxysilane, anthracyl dimethoxysilane, anthracyl diethoxysilane, methyl phenyl dimethoxysilane, methyl phenyl diethoxysilane, methyl phenyl dipropoxysilane, methyl phenyl diphenyloxysilane, ethyl phenyl dimethoxysilane, ethyl phenyl diethoxysilane, methyl anthracyl dimethoxysilane, ethyl anthracydiethoxysilane, propyl anthracyl dipropoxysilane, methyl phenyl ethoxypropoxysilane, ethyl phenyl methoxyethoxysilane, diphenyl dimethoxysilane, diphenyl methoxyethoxysilane, phenyl trimethoxysilane, phenyl triethoxysilane, phenyl tripropoxysilane, anthracyl trimethoxysilane, anthracyl tripropoxysilane, phenyl triphenyloxysilane, phenyl monomethoxydiethoxysilane, anthracyl monomethoxydiethoxysilane, phenyl monomethoxydipropoxysilane, phenyl monomethoxydiphenyloxysilane, anthracyl monomethoxydipropoxysilane, anthracyl monomethoxy diphenyloxysilane, phenyl methoxyethoxypropoxysilane, anthracyl methoxyethoxypropoxysilane, phenyl monomethoxymonoethoxymonobutoxysilane, and anthracyl monomethoxymonoethoxymonobutoxysilane, and oligomers thereof.

Preferred among these compounds are acetoxyethyltrimethoxysilane, methyltrimethoxysilane, triethoxysilane, tetraethoxysilane, methyltriethoxysilane, dimethyidiethoxysilane, tetramethoxysilane, methyltrimethoxysilane, trimethoxysilane, dimethyldimethoxysilane, phenyltriethoxysilane, phenyltrimethoxysilane, diphenyldiethoxysilane, diphenyldimethoxysilane, 2-(3,4-epoxycyclohexyl)ethyl-trimethoxysilane, 2-(3,4-epoxycyclohexyl)ethyl-triethoxysilane, (glycidyloxypropyl)-trimethoxysilane, (glycidyloxypropyl)-triethoxysilane, phenyl trimethoxysilane, phenyl triethoxysilane, and phenyl tripropoxysilane. In another embodiment the preferred monomers are acetoxyethyltrimethoxy, tetraethoxysilane, methyltriethoxysilane, tetramethoxysilane, methyltrimethoxysilane, trimethoxysilane, phenyltriethoxysilane, phenyltrimethoxysilane, and 2-(3,4-epoxycyclohexyl)ethyl-trimethoxysilane, and 2-(3,4-epoxycyclohexyl )ethyl-triethoxysilane.

The polymer of the present invention can comprises units derived from the monomers: acetoxyethyltrimethoxysilane, tetraethoxysilane, phenyltriethoxysilane, or a polymer derived from the monomers: acetoxyethyltrimethoxysilane, phenyltriethoxysilane methytrimethoxysilane, or a polymer derived from the monomers: acetoxyethyltrimethoxysilane, tetraethoxysilane, or a polymer derived from acetoxyethyltrimethoxysilane.

The polymers of this invention are polymerized to give a polymer with a weight average molecular weight from about 1,000 to about 500,000, preferably from about 2,000 to about 50,000, more preferably from about 3,000 to about 30,000, referenced against polystyrene.

The antireflection coating composition of the present invention contains 1 weight % to about 15 weight % of the silicon polymer, and preferably 2 weight % to about 10 weight % of total solids. The crosslinking agent, may be incorporated in a range from about 0.1 to about 10 weight % by total solids of the antireflective coating composition, preferably from 0.3 to 5 weight % by solids, and more preferably 0.5 to 2.5 weight % by solids.

The solid components of the antireflection coating composition are mixed with a solvent or mixtures of solvents that dissolve the solid components of the antireflective coating. Suitable solvents for the antireflective coating composition may include, for example, a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof.

The antireflective coating composition comprises the silicon polymer, and the crosslinking agent of the instant invention and a suitable solvent or mixtures of solvents. Other components may be added to enhance the performance of the coating, e.g. lower alcohols, surface leveling agents, adhesion promoters, antifoaming agents, photoacid generators, thermal acid generators, etc.

Since the antireflective film is coated on top of the substrate and is further subjected to dry etching, it is envisioned that the film is of sufficiently low metal ion level and of sufficient purity that the properties of the semiconductor device are not adversely affected. Treatments such as passing a solution of the polymer through an ion exchange column, filtration, and extraction processes can be used to reduce the concentration of metal ions and to reduce particles.

The absorption parameter (k) of the novel absorbing compositional embodiments ranges from about 0.05 to about 1.0, preferably from about 0.05 to about 0.6, more preferably 0.5 to about 0.35 as measured using ellipsometry at the exposure wavelength. The refractive index (n) of the antireflective coating is also optimized and can range from 1.3 to about 2.0, preferably 1.5 to about 1.8. For nonabsorbing embodiment the k value is less than 0.02, preferably less than 0.01. The n and k values can be calculated using an ellipsometer, such as the J. A. Wooliam WVASE VU-32™ Ellipsometer. The exact values of the optimum ranges for k and n are dependent on the exposure wavelength used and the type of application. Typically for 193 nm the preferred range for k is about 0.05 to about 0. 0.3, and for 248 nm the preferred range for k is about 0.15 to about 0.3.

The antireflective coating composition is coated on the substrate using techniques well known to those skilled in the art, such as dipping, spin coating or spraying. The film thickness of the antireflective coating ranges from about 15 nm to about 200 nm. The coating is further heated on a hot plate or convection oven for a sufficient length of time to remove any residual solvent and induce crosslinking or curing, and thus insolubilizing the antireflective coating to prevent intermixing between the antireflective coatings. The preferred range of temperature is from about 100° C. to about 300° C. A film of photoresist is then coated on top of the uppermost antireflective coating and baked to substantially remove the photoresist solvent. An edge bead remover may be applied after the coating steps to clean the edges of the substrate using processes well known in the art.

The substrates over which the antireflective coatings are formed can be any of those typically used in the semiconductor industry. Suitable substrates include, without limitation, silicon, silicon substrate coated with a metal surface, copper coated silicon wafer, copper, aluminum, polymeric resins, silicon dioxide, metals, doped silicon dioxide, silicon nitride, tantalum, polysilicon, ceramics, aluminum/copper mixtures; gallium arsenide and other such Group III/N compounds. The substrate may comprise any number of layers made from the materials described above.

Photoresists can be any of the types used in the semiconductor industry, provided the photoactive compound in the photoresist and the antireflective coating absorb at the exposure wavelength used for the imaging process.

To date, there are several major deep ultraviolet (uv) exposure technologies that have provided significant advancement in miniaturization, and these radiation of 248 nm, 193 nm, 157 and 13.5 nm. Photoresists for 248 nm have typically been based on substituted polyhydroxystyrene and its copolymers/onium salts, such as those described in U.S. Pat. Nos. 4,491, 628 and 5,350,660. On the other hand, photoresists for exposure below 200 nm require non-aromatic polymers since aromatics are opaque at this wavelength. U.S. Pat. Nos. 5,843, 624 and 6,866,984 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon to hydrogen ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers. Any of the known types of 193 nm photoresists may be used, such as those described in U.S. Pat. Nos. 6,447,980 and 6,723,488, and incorporated herein by reference.

Two basic classes of photoresists sensitive at 157 nm, and based on fluorinated polymers with pendant fluoroalcohol groups, are known to be substantially transparent at that wavelength. One class of 157 nm fluoroalcohol photoresists is derived from polymers containing groups such as fluorinated-norbornenes, and are homopolymerized or copolymerized with other transparent monomers such as tetrafluoroethylene (U.S. Pat. Nos. 6,790,587, and 6,849,377) using either metal catalyzed or radical polymerization. Generally, these materials give higher absorbencies but have good plasma etch resistance due to their high alicyclic content. More recently, a class of 157 nm fluoroalcohol polymers was described in which the polymer backbone is derived from the cyclopolymerization of an asymmetrical diene such as 1,1,2,3,3-pentafluoro-4-trifluoromethyl-4-hydroxy-1,6-heptadiene (Shunichi Kodama et al Advances in Resist Technology and Processing XIX, Proceedings of SPIE Vol. 4690 p76 2002; U.S. Pat. No. 6,818,258) or copolymerization of a fluorodiene with an olefin (WO 01/98834-A1). These materials give acceptable absorbance at 157 nm, but due to their lower alicyclic content as compared to the fluoro-norbornene polymer, have lower plasma etch resistance. These two classes of polymers can often be blended to provide a balance between the high etch resistance of the first polymer type and the high transparency at 157 nm of the second polymer type. Photoresists that absorb extreme ultraviolet radiation (EUV) of 13.5 nm are also useful and are known in the art.

After the coating process, the photoresist is imagewise exposed. The exposure may be done using typical exposure equipment. The exposed photoresist is then developed in an aqueous developer to remove the treated photoresist. The developer is preferably an aqueous alkaline solution comprising, for example, tetramethyl ammonium hydroxide. The developer may further comprise surfactant(s). An optional heating step can be incorporated into the process prior to development and after exposure.

The process of coating and imaging photoresists is well known to those skilled in the art and is optimized for the specific type of resist used. The patterned substrate can then be dry etched with an etching gas or mixture of gases, in a suitable etch chamber to remove the exposed portions of the antireflective film, with the remaining photoresist acting as an etch mask. Various etching gases are known in the art for etching organic antireflective coatings, such as those comprising $CF_4$, $CF_4/O_2$, $CF_4/CHF_3$, or $Cl_2/O_2$.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The refractive index (n) and the absorption (k) values of the antireflective coating in the Examples below were measured on a J. A. Woollam VASE32 ellipsometer.

The molecular weight of the polymers was measured on a Gel Permeation Chromatograph.

Example 1

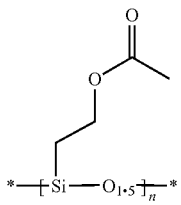

79 g of Poly(acetoxyethylsilsesquioxane) (available from Gelest Inc. 612 William Leigh Drive, Tullytown, Pa., under the name SST-BAE1.2) which was a 18-20% solution in propylene glycol monomethyl ether (PGME)) was diluted with additional PGME to achieve 5 wt. % of total solids and then filtered. This homogeneous solution was spin-coated on a silicon wafer at 1500 rpm to give a film thickness of 100 nm. The coated wafer was baked on a hotplate at 250° C. for 90 seconds. The n and k values were measured at 193 nm wavelength and were found to have n=1.63, and k=0.01.

Lithography evaluation: The underlayer AZ® ArF-1C5D (available from AZ® Electronic Materials USA Corp, 70 Meister Ave., Somerville, N.J.) was coated on top of a silicon wafer to give a 37 nm film when baked at 200° C. for 60 sec. The formulation from above was then coated on top of the underlayer, baked on a hotplate at 250° C. for 90 seconds to give a film of 100 nm. A photoresist, AZ® AX2110P (available from AZ® Electronic Materials USA Corp, 70 Meister Ave., Somerville, N.J.), was softbaked 110° C./60 sec to give a film thickness of 160 nm. The layers were exposed on a ArF scanner (Nikon NSR-306D: NA=0.85, Dipole Y Illumination, 0.8s, a/R=0.63, Reticle: 6% HTPSM) interfaced to a TEL Act 12 track, and developed with AZ300MIF at 23° C. for 30 sec. The layers were postexposure baked at 110° C. for 60 sec. The cross-section from a scanning electron microscope (SEM) pictures of the wafers showed that acceptable 80 nm L/S (line/space) features were easily resolved with some footing at the bottom of the photoresist profiles.

Example 2

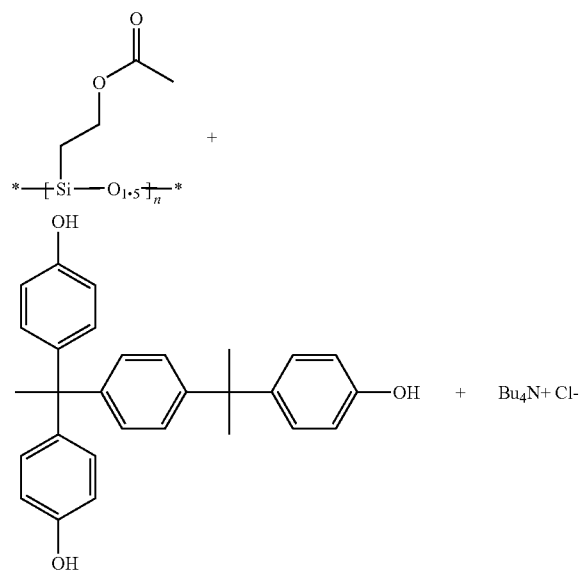

79 g of SST-BAE1.2, 1.5 g of alpha,alpha,alpha'-Tris(4-hydroxyphenyl)-1-ethyl-4-isopropylbenzene (Dye), 12 g of 5% tetrabutylammonium chloride in PGME and 240 g of PGME were mixed. After shaking for one day the formulation was filtered through 0.2 micron filter. This homogeneous solution was spin-coated on a silicon wafer at 2000 rpm. The coated wafer was baked on hotplate at 250° C. for 90 seconds to give a film thickness of 59.9 nm. The n and k values were measured at 193 nm wavelength and were found to be n=1.62, and k=0.125 at 193 nm. The lithographic evaluation was done with the same procedure outlined in Example 1. The cross-section SEM pictures of the wafers showed that acceptable 80 nm L/S features were easily resolved with some slight footing at the bottom of the photoresist profiles.

Example 3

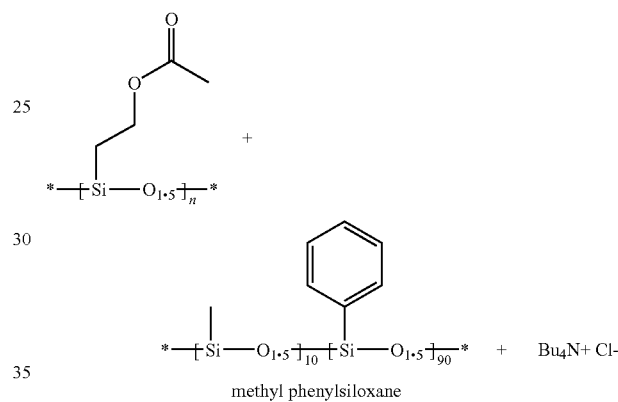

methyl phenylsiloxane 29.47 g of SST-BAE1.2, 1.4 g of SST-3PM1 (methyl phenylsiloxane polymer as shown and available from Gelest Inc.), 5.6 g of 5% tetrabutylammonium chloride in PGME and 113.8 g of PGME were mixed. After mixing for one day the formulation was filtered through 0.2 micron filter. This homogeneous solution was spin-coated on a silicon wafer at 1500 rpm. The coated wafer was baked on a hotplate at 250° C. for 90 seconds. Then, n and k values were measured at 193 nm wavelength and were found to be n=1.73, k=0.157.

The lithography evaluation was done with the same procedure outlined in Example 1. Cross-section SEM pictures of the wafers showed acceptable 80 nm L/S features were easily resolved with some slight footing at the bottom of the photoresist profiles.

Example 4

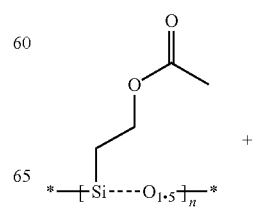

-continued

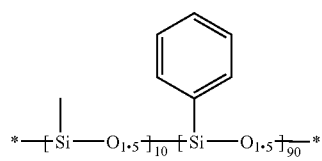

29.47 g of SST-BAE1.2, 1.4 g of SST-3PM1, 5.6 g of 5% DPI-PFSI-Cy6 (diphenyl iodonium salt available from Toyo Gosei. LTD Hacchouboru Tohkou BLD Chuo-Ku Tokyo, Japan) in PGME and 113.8 g of PGME were mixed. After one day the formulation was filtered through 0.2 micron filter. This homogeneous solution was spin-coated on a silicon wafer at 1500 rpm. The coated wafer was baked on hotplate at 250° C. for 90 seconds. Then, n and k values were measured at 193 nm wavelength and were found to be n=1.73, k=0.157.

The lithographic evaluation was done with the same procedure outlined in Example 1. Cross-section SEM pictures of the wafers showed acceptable 80 nm L/S features were easily resolved with significantly less footing at the bottom of the photoresist profiles as compared to Examples 1 through 3.

Example 5

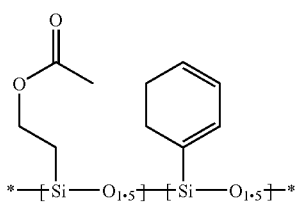

In a 100 mL round-bottom flask equipped with a magnetic stirrer, thermometer, and condenser, was charged 30 g of acetoxyethyltrimethoxysilane, 6 g of phenyltrimethoxysilane, 6 g of distilled water and 1.8 mL of acetic acid. The flask was heated to 90° C. under nitrogen for 24 hrs. The volatiles were removed using a rotary evaporator. The glassy material was diluted with 250 g PGME. The combined weight was 274 g, the resin was determined to have a weight of 24 g. This solution was further diluted to 2.5% solid using PGME and filtered through 0.2 micron filter.

0.25 g of 3.2% tetrabutylammonium chloride in PGME was added to 20 g of the formulation above. After one day of shaking the formulation was filtered through 0.2 micron filter. This homogeneous solution was spin-coated on a silicon wafer at 1500 rpm. The coated wafer was baked on hotplate at 250° C. for 90 seconds. Then, n and k values were measured at 193 nm wavelength and were found to be n=1.76, k=0.227.

The lithographic evaluation was done with the same procedure outlined in Example 1. Cross-section SEM pictures of the wafers showed acceptable 80 nm L/S features were easily resolved with some footing at the bottom of the photoresist profiles.

Example 6

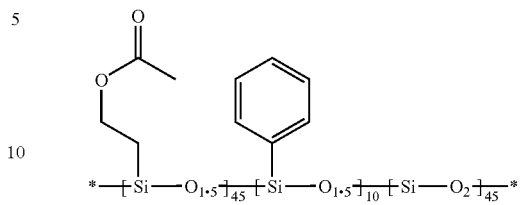

(10% Phenylsilsesquioxane)-(45% acetoxyethylsilsesquioxane)-(45% Q-resin) terpolymer, as shown above, in PGME (Gelest product XG-1552)) was diluted with additional PGME to achieve 5 wt. % of total solids and filtered. This homogeneous solution was spin-coated on a silicon wafer at 1500 rpm. The coated wafer was baked on hotplate at 250° C. for 90 seconds. Film thickness was determined to be 97.0 nm. Then, n and k values were measured at 193 nm wavelength were found to be n=1.68, k=0.19.

The lithographic evaluation was done with the same procedure outlined in Example 1. Cross-section SEM pictures of the wafers showed acceptable 80 nm L/S features were easily resolved with some footing at the bottom of the photoresist profiles.

Example 7

In a three-neck 250 mL round-bottom flask equipped with a magnetic stirrer, thermometer, and condenser, was charged 9.00 g of 2-(3,4-epoxycyclohexyl)ethyl-trimethoxysilane (37 mmol), 7.20 g of phenyltrimethoxysilane (36 mmol), 11.50 g of acetoxyethyltrimethoxysilane (55 mmol), and 9.00 g of triethoxysilane (55 mmol). To the flask, was added a mixture of 5.00 g of deionized water, 1.60 g of acetic acid, and 15 g of isopropanol. The mixture was heated to reflux and kept at that temperature for 3 hours. Then, the mixture was cooled to room temperature. The volatiles were removed under reduced pressure. The weight average molecular weight was approximately 18,950 g/mol, determined by gel permeation chromatography using polystyrenes as reference.

Example 8

In a three-neck 250 mL round-bottom flask equipped with a magnetic stirrer, thermometer, and condenser, was charged 36.00 g of 2-(3,4-epoxycyclohexyl)ethyl-trimethoxysilane (146 mmol), 28.80 g of phenyltrimethoxysilane (145 mmol), 46.00 g of acetoxyethyltrimethoxysilane (221 mmol), and 36.00 g of triethoxysilane (219 mmol). To the flask, was added a mixture of 20.00 g of D.I. water, 6.40 g of acetic acid, and 60 g of isopropanol. The mixture was heated to reflux and kept at that temperature for 2 hours. Then, the mixture was cooled to room temperature. The volatiles were removed under reduced pressure. The weight average molecular weight is approximately 2,620 g/mol, determined by gel permeation chromatography using polystyrene as reference.

Example 9

In a three-neck 250 mL round-bottom flask equipped with a magnetic stirrer, thermometer, and condenser, was charged 18.00 g of acetoxyethyltrimethoxysilane (86 mmol), 9.00 g of phenyltrimethoxysilane (45 mmol), and 16.00 g of triethoxysilane (97 mmol). To the flask, was added a mixture of 6.30 g of deionized water, 2.00 g of acetic acid, and 19 g of isopropanol. The mixture was heated to reflux and kept at that temperature for 3 hours. Then, the mixture was cooled to room temperature. The solvents were removed under reduced pressure to give 27.64 g of a colorless liquid resin. The weight average molecular weight was approximately 3,070 g/mol, determined by gel permeation chromatography using polystyrene as reference.

Example 10

In a three-neck 500 mL round-bottom flask equipped with a magnetic stirrer, thermometer, and condenser, was charged 41.66 g of acetoxyethyltrimethoxysilane (0.20 mol), 19.83 g of phenyltrimethoxysilane (0.10 mol), and 27.24 g of methyltrimethoxysilane (0.20 mol). To the flask, was added a mixture of 90.08 g of acetic acid and 4.76 g of p-toluenesulfonic acid. The mixture was heated to 70° C. and kept at that temperature for 7 hours. Then, the mixture was cooled to room temperature and precipitated in deionized water. A white gummy solid was isolated. 1 H NMR confirmed the structure.

Example 11

1.5 g of the silicon polymer prepared in Example 7 and 0.015 g of diphenyliodonium perfluoro-1-butanesulfonate-was dissolved in a mixture of propylene glycol monomethyl ether acetate (PGMEA) and propylene glycol monomethyl ether (PGME) to achieve 6.06 wt.% of total solids. This homogeneous solution was spin-coated on a silicon wafer at 1500 rpm. The coated wafer was baked on a hotplate at 250° C. for 90 seconds. Then, n and k values were measured with a VASE Ellipsometer manufactured by J. A. Woollam Co. Inc. The optical constants n and k of the Si-containing film for 193 nm radiation were 1.744 and 0.234, respectively.

Example 12

1.5 g of the epoxy silicon polymer prepared in Example 8 was dissolved in a mixture of propylene glycol monomethyl ether acetate (PGMEA) and propylene glycol monomethyl ether (PGME) to achieve 5.0 wt. % of total solids. This homogeneous solution was spin-coated on a silicon wafer at 1500 rpm. The coated wafer was baked on a hotplate at 250° C. for 90 seconds. Then, n and k values were measured with a VASE Ellipsometer manufactured by J. A. Woollam Co. Inc. The optical constants n and k of the Si-containing film for 193 nm radiation were 1.772 and 0.304, respectively.

Example 13

1.5 g of the silicon polymer prepared in Example 7 and 0.015 g of diphenyliodonium perfluoro-1-butanesulfonate was dissolved in a mixture of propylene glycol monomethyl ether acetate (PGMEA) and propylene glycol monomethyl ether (PGME) to achieve 6.06 wt. % of total solids. This homogeneous solution was spin-coated on a silicon wafer at 1500 rpm. The coated wafer was baked on hotplate at 250° C. for 90 seconds. Then, a layer of AZ® AX2110P photoresist (available from AZ Electronic Materials USA Corp.) was spin-coated over the cured layer. The lithographic evaluation was done with the same procedure outlined in Example 1. Cross-sectional SEM pictures of the wafers showed that acceptable 80 nm L/S features were easily resolved with some slight footing at the bottom of the photoresist profiles.

Example 14

1.5 g of the SS polymer prepared in Example 8 and 0.015 g of diphenyliodonium perfluoro-1-butanesulfonate was dissolved in a mixture of propylene glycol monomethyl ether acetate (PGMEA) and propylene glycol monomethyl ether (PGME) to achieve 7.11 wt. % of total solids. This homogeneous solution was spin-coated on a silicon wafer at 2500 rpm. The coated wafer was baked on hotplate at 225° C. for 90 seconds. Then, a layer of AZ® AX2110P photoresist (available from AZ Electronic Materials USA Corp.) was spin-coated over the cured layer. The lithographic evaluation was done with the same procedure outlined in Example 1. Cross-sectional SEM pictures of the wafers showed that acceptable 80 nm L/S features were easily resolved with some slight footing at the bottom of the photoresist profiles.

The invention claimed is:

1. An antireflecting coating composition which is capable of forming a crosslinked coating underneath a layer of photoresist comprising a silicon polymer, where the silicon polymer comprises at feast one unit with the structure 1,

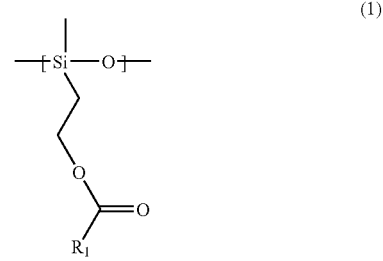

where, $R_1$ is selected from $C_1$-$C_4$ alkyl, further where the silicon polymer comprises an absorbing chromophore capable of absorbing radiation used for exposing the photoresist, and further where the composition is free of units comprising Si—H and where the composition comprises a crosslinking catalyst.

2. The antireflecting coating composition of claim 1, wherein the chromophore is selected from the group consisting of hydrocarbon aromatic rings, substituted phenyl, unsubstituted phenyl, substituted anthracyl, unsubstituted anthracyl, substituted phenanthracyl, unsubstituted phenanthracyl, substituted naphthyl, unsubstituted naphthyl, substituted heterocyclic aromatic rings, unsubstituted heterocyclic aromatic rings, and combinations thereof wherein the hetero atoms present in the hetero cyclic rings are selected from the group consisting of oxygen, nitrogen, sulfur and combinations thereof.

3. The antireflecting coating composition of claim 1, where the absorbing chromophore has the structure 3,

where n=0-4.

4. The antireflecting coating composition of claim 1, where the catalyst is selected from a photoacid generator, thermal acid generator and a salt.

5. The antireflecting coating composition of claim 1, where the composition is free of units comprising Si-halogen.

6. The antireflecting coating composition of claim 1, where the composition has less than 10 Si—OH per 100 Si atoms.

7. A process for forming an image comprising:
a) providing a coating of the coating composition of claim 1 on a substrate;
b) providing a photoresist layer;
c) imagewise exposing the top and bottom layer to actinic radiation of same wavelength;
d) postexposure baking the substrate,
e) developing the photoresist layer with an aqueous alkaline solution.

8. The process according to claim 7, where the exposing actinic radiation has wavelength is in the range of 300 nm to 10 nm.

9. An antireflecting coating composition which is capable of forming a crosslinked coating underneath a layer of photoresist comprising a silicon polymer, where the silicon polymer comprises at least one unit with the structure 1,

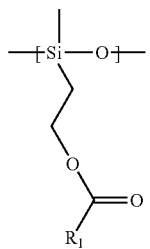

(1)

where, $R_1$ is selected from $C_1$-$C_4$ alkyl, further where the silicon polymer comprises an absorbing chromophore capable of absorbing radiation used for exposing the photoresist, and further where the composition is free of units comprising Si—H and where the composition further comprises a dye.

10. The antireflecting coating composition of claim 9, where dye is a small molecule compound or an absorbing polymer.

11. The antireflecting coating composition of claim 10, where the absorbing polymer comprises at least one a unit of structure 2,

(2)

where n=0-4.

12. The antireflecting coating composition of claim 9, where the dye comprises a chromophore selected from hydrocarbon aromatic rings, substitute phenyl, unsubstituted phenyl, substituted anthracyl, unsubstituted anthracyl, substituted phenanthracyl, unsubstituted phenanthracyl, substituted naphthyl, unsubstituted naphthayl, substituted heterocyclic aromatic rings, unsubstituted heterocyclic aromatic rings, and combinations thereof wherein the hetero atoms present in the hetero cyclic rings are selected from the group consisting of oxygen, nitrogen, sulfur and combinations thereof.

13. The antireflecting coating composition of claim 9, further comprising a crosslinking catalyst.

14. The antireflecting coating composition of claim 13, where the catalyst is selected from a photoacid generator, thermal acid generator and a salt.

* * * * *